United States Patent
Garrec et al.

(10) Patent No.: US 9,667,197 B2
(45) Date of Patent: May 30, 2017

(54) SIGNAL AMPLIFICATION SYSTEM

(71) Applicants: THALES, Courbevoie (FR);
INSTITUT POLYTECHNIQUE DE BORDEAUX, Talence (FR);
UNIVERSITE DE BORDEAUX, Bordeaux (FR); CENTRE NATIONAL DE LA RECHERCHE SCIENTIFIQUE, Paris (FR)

(72) Inventors: Patrick Garrec, Merignac (FR); Eric Kerherve, Pessac (FR); Pascal Cornic, Guilers (FR); Stéphane Kemkemian, Elancourt (FR); Nejdat Demirel, Pessac (FR); Yves Mancuso, Le Plessis-Robinson (FR)

(73) Assignees: THALES, Courbevoie (FR);
INSTITUT POLYTECHNIQUE DE BORDEAUX, Talence (FR);
UNIVERSITE DE BORDEAUX, Bordeaux (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/764,148

(22) PCT Filed: Feb. 27, 2014

(86) PCT No.: PCT/EP2014/053866
§ 371 (c)(1),
(2) Date: Jul. 28, 2015

(87) PCT Pub. No.: WO2014/131849
PCT Pub. Date: Sep. 4, 2014

(65) Prior Publication Data
US 2015/0372649 A1    Dec. 24, 2015

(30) Foreign Application Priority Data

Feb. 28, 2013  (FR) .................................... 13 00453

(51) Int. Cl.
H03F 1/14    (2006.01)
H03F 3/68    (2006.01)
(Continued)

(52) U.S. Cl.
CPC ............. *H03F 1/0288* (2013.01); *H03F 3/19* (2013.01); *H03F 3/211* (2013.01);
(Continued)

(58) Field of Classification Search
CPC .......... H03F 1/0288; H03F 3/19; H03F 3/211; H03F 3/45089; H03F 3/72;
(Continued)

(56) References Cited

U.S. PATENT DOCUMENTS 5,774,017 A * 6/1998 Adar ..................... H03F 1/0261
                                                    330/126
7,656,227 B1 * 2/2010 Beaudoin ................ H03F 1/32
                                                    330/124 D
(Continued)

FOREIGN PATENT DOCUMENTS

EP        2 159 912 A1     3/2010
JP     WO 2008099464 A1 *  8/2008  .......... H03F 1/0277
WO       2008/099464 A1    8/2008

*Primary Examiner* — Steven J Mottola
*Assistant Examiner* — Hafizur Rahman
(74) *Attorney, Agent, or Firm* — Baker Hostetler LLP

(57) ABSTRACT

An input signal amplification system comprises at least two different means of amplifying input signals in order to obtain amplified signals. It also comprises at least one means of summing amplified signals, and dynamic means of activating or deactivating one or more of the amplifying means based on input signals.

11 Claims, 5 Drawing Sheets

(51) Int. Cl.
  *H03F 1/02* (2006.01)
  *H03F 3/21* (2006.01)
  *H03F 3/72* (2006.01)
  *H03F 3/45* (2006.01)
  *H03F 3/19* (2006.01)

(52) U.S. Cl.
  CPC ........... *H03F 3/45089* (2013.01); *H03F 3/72* (2013.01); *H03F 2200/301* (2013.01); *H03F 2200/537* (2013.01); *H03F 2200/541* (2013.01); *H03F 2203/21109* (2013.01); *H03F 2203/45731* (2013.01)

(58) Field of Classification Search
  CPC ......... H03F 2200/301; H03F 2200/537; H03F 2200/541; H03F 2203/21109; H03F 2203/45731
  USPC ........ 330/51, 84, 109, 124 R, 126, 147, 295
  See application file for complete search history.

(56) References Cited

U.S. PATENT DOCUMENTS

| | | | |
|---|---|---|---|
| 8,476,979 B1* | 7/2013 | Simons | H03F 1/0261 330/207 P |
| 8,824,976 B2* | 9/2014 | See | H01Q 5/50 330/51 |
| 2006/0267682 A1* | 11/2006 | Grebennikov | H03F 1/0277 330/51 |
| 2009/0115512 A1 | 5/2009 | Grondahl et al. | |
| 2010/0225398 A1 | 9/2010 | Shibata | |
| 2012/0081182 A1 | 4/2012 | Lender, Jr. et al. | |
| 2012/0105147 A1* | 5/2012 | Harris | H03F 1/56 330/57 |

* cited by examiner

SIGNAL AMPLIFICATION SYSTEM

CROSS-REFERENCE TO RELATED APPLICATIONS

This application is a National Stage of International patent application PCT/EP2014/053866, filed on Feb. 27, 2014, which claims priority to foreign French patent application No. FR 1300453, filed on Feb. 28, 2013, the disclosures of which are incorporated by reference in their entirety.

FIELD OF THE INVENTION

The present invention relates to a system for amplifying transmission signals with a large frequency bandspread typically of several octaves (e.g. more than four) and/or which may vary over time. This type of system is used in particular in systems comprising a set of sensors, or more generally in transmissions having different functions or comprising a set of antennas. Signals originating from different transmissions generally have a frequency bandspread that is variable over time.

BACKGROUND

Systems are known for signal amplification, whereof the frequency bandspread is large. However, these systems have the drawback of causing excessive energy consumption, when they are used for amplifying signals having a narrow frequency bandspread typically less than one octave. In the case of signals having a narrow frequency bandspread, the efficiency of these systems is then very bad, it is then necessary to increase the power of the transmission circuits. This increase leads to a need for cooling these systems, a cooling device which is also energy-consuming.

Document EP2159912 describes a Doherty amplification system including a main amplifier with a relatively wide band and two auxiliary amplifiers with a narrower band. The auxiliary amplifiers operate in a mutually exclusive way; their bands are included in that of the main amplifier. This amplification system presents a relatively narrow band, much less than one octave, notably because of the use of quarter-wave phase shifters.

Systems are known which comprise a set of sensors having different functions or a set of antennas, and which distribute the received signals in different subbands. These systems then amplify the signals by subbands. However these systems are not adaptive in frequency and/or in power and efficiency, and therefore may not be adapted to the amplification of signals whereof the frequency bandspread is not known a priori.

Class switching is a known operation for increasing the efficiency of amplifiers.

SUMMARY OF THE INVENTION

The present invention is therefore aimed at remedying these problems by providing an adaptive amplification system both in frequency and in power, and in signal shape (signal shape is understood to mean class, modulation type or pulse type), whereof the efficiency is optimal for a set of frequency bandspread.

Thus, according to one aspect of the invention, an input signal amplification system is provided comprising at least two different means of amplifying the input signals. The system also comprises a means of summing the amplified signals. The system also comprises dynamic means of activating/deactivating one or more of the amplifying means based on the input signals.

The system may therefore be adapted so that efficiency is optimal for a set of different signal frequency bandspreads. Thus it is possible to select one of the amplifying means so that it has maximum efficiency for a signal having a large frequency bandspread. It is possible to select the other amplifying means so that it has a maximum efficiency for a signal having a narrow frequency bandspread. Then the signals amplified by the two amplifying means may be summed, which enables the system to be connected to a single antenna. The means of turning off allow same to use, at a given instant, only the useful amplifying means. This therefore makes it possible to limit the energy used by the system and to limit the heating of this system. Furthermore, this system as described in the invention is compact because it can be completely fitted onto a single microelectronic chip. In particular, the system occupies a volume whose characteristic dimension is of the order of magnitude of the mesh size of the antenna (8 mm in the case of an antenna for transmitting a signal whereof the modulation frequency is 18 GHz). The constraint of compactness is even more important when considering dual polarization.

Advantageously the system further comprises adapting means placed before the amplifying means, said activating/deactivating means being further adapted for activating/deactivating said adapting means.

Advantageously the system further comprises means of reconfiguring said two amplifying means.

According to one technical feature, at least two of the amplifying means are adapted for amplifying signals whereof the frequency bandspread is different. More particularly, at least one amplifying means is adapted for amplifying a signal whereof the bandspread has a width less than or equal to one octave and/or another amplifying means is adapted for amplifying a signal whereof the bandspread has a width greater than or equal to one, or even two, and preferably four, octaves.

According to one technical feature at least two of the amplifying means are produced using a different production technology.

According to one technical feature at least one of the amplifying means is produced using SiGe and at least one of the amplifying means is produced using GaN.

Production may be implemented in SiGe, which offers the advantage of a low cost thanks to its intensive use in mobile telephony and a high level of integration owing to the high number of metalization layers. On the other hand, its low supply voltages do not allow large output powers. Production may also use GaN technology, which allows having larger output powers with a higher cost due to being less widespread, this technology being less mature.

According to one technical feature at least two of the amplifying means use a different operating class.

An amplifier operating class is represented by a letter for characterizing the amplifiers of this class. The sinusoidal classes (A, AB, B, C) may be distinguished from the switched classes (D, E, F, S).

The sinusoidal classes (A, AB, B, C) are defined by the relationship between the shape of the input signal and that of the output signal and by the duration during which an active component is used during a signal amplification. This duration is measured in degrees or as a percentage of the period of a test sinusoidal signal applied at the input of the amplifier, 100% or 360 degrees representing a complete cycle.

For linear amplifiers each class defines the proportion of the input signal that is used by each active component for arriving at the amplified signal.

Class A: The whole of the input signal (100%) is used.
Class B: Half the input signal (50%) is used.
Class AB: More than half but not the whole of the signal (50-100%) is used.
Class C: Less than half (0-50%) of the signal is used.

Advantageously the activating/deactivating means are adapted for activating the amplifying means for which the performance is optimal depending on a frequency bandspread associated with said input signals.

Advantageously the activating/deactivating means are adapted for activating the amplifying means for which the performance is optimal depending on a center frequency associated with said input signals.

According to one technical feature, at least one of the amplifying means is adapted for amplifying signals consisting of a pure carrier modulated in phase- and/or amplitude- and/or frequency- and at least one of the amplifying means and/or said adapting means are adapted for amplifying signals consisting of a succession of pulses.

The advantage of having a system of heterogeneous amplifiers is that the operation of the amplifiers can be adapted dynamically as needed and to the characteristics of the signal to be amplified. A continuous phase- and/or amplitude- and/or frequency modulated transmission requires a constant power supply. A pulse transmission allows the use of an energy reservoir and is similar to modulators.

The dynamic modification of tuning circuits can be used for frequency hopping and for adapting to the useful bandwidth, by optimizing the efficiency.

A dynamic change in the center frequency is also possible. This change will enable adapting to the frequency to be transmitted and protecting from the generation of harmonics inherent to broadband transmission.

According to one technical feature the system further comprises means of measuring the internal temperature of the system. Furthermore, the activating/deactivating means are adapted for activating/deactivating at least one of the amplifying means when the internal temperature of the system exceeds a temperature threshold and/or the reconfiguring means are adapted for reconfiguring at least one of the amplifying means when the internal temperature exceeds a temperature threshold.

This technical feature prevents the risk of overheating and of destruction of the system. Furthermore, it enables turning off only some of the amplifying means, when the system is overheating and enables the system to remain operational.

Monitoring the internal temperature, programmed according to the technology used, preserves overall operation and avoids destruction of the circuit, while dynamically offloading functions deemed to be operationally less critical. The choice of functions to be offloaded is made on a case by case basis. The reduction in the transmitted power will reduce the radar range in the ratio of 20% for 3 dB of drop in power. A dynamic adaptation the power transmitted for data links may even help to reduce the power transmitted and to adapt same to what is strictly necessary for meeting the link requirement.

According to one technical feature, the system also comprises at least one active electronically scanned antenna for the transmission of said summed signals.

The active electronically scanned antenna is also known as an AESA for 'Active Electronically Scanned Array'.

In radar or in telecommunication, an electronically scanned antenna is used to direct the antenna beam in a given direction using signal phasing. This eliminates mechanical pointing means. A phased array antenna is a group of elementary antennas fed with signals the phase of which is adjusted so as to obtain the desired radiating pattern. Generally it is pointing the antenna beam in a given direction. This steering agility can be used to point to multiple targets at the same time (on the scale of target movement). It is also possible to create multiple sub-beams on transmission and/or on reception.

A passive electronically scanned antenna carries out the formation of the transmitted (or received) beam thanks to a set of electronic devices such as phase shifters, switches, attenuators. The signal to be transmitted is distributed by an array or by radiation to a set of modules comprising a phase shifter and radiating element. The devices for amplifying the transmitted or received signals are implemented outside the antenna.

An active electronically scanned antenna corresponds to a passive antenna whereof the devices for amplifying the transmitted or received signals are included in the antenna. It may also contain advanced electronic receiving devices, like frequency conversion or signal coding, phase shifts may be implemented by programmable pure delays. Compared to an array antenna, an active antenna is characterized by the fact that these active modules are placed between the N radiating elements and their outputs. All of the electronics is therefore implemented in the mesh of the array.

BRIEF DESCRIPTION OF THE DRAWINGS

The invention will be better understood and other advantages will emerge on reading the detailed description given as a non-restrictive example and with the aid of the figures in which.

DETAILED DESCRIPTION

Figure 1:
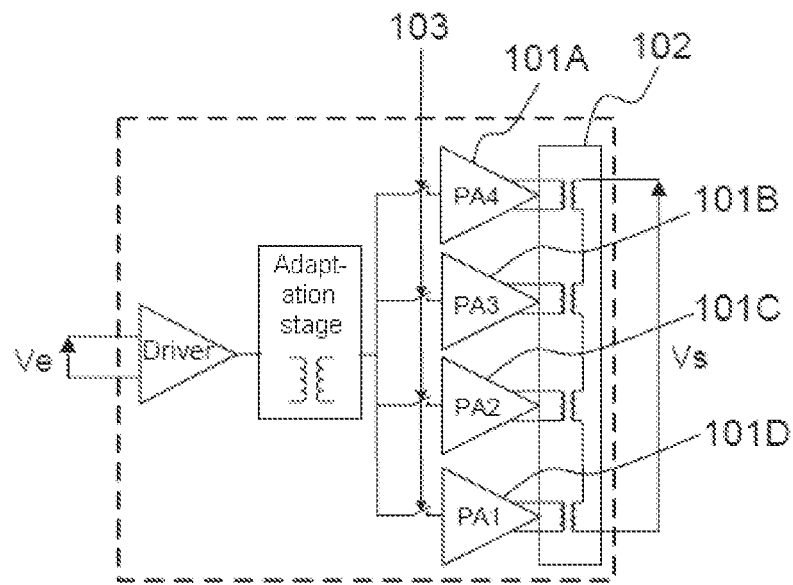
FIG. 1 depicts a first embodiment of the system set out in the invention

The system described on FIG. 1 allows the amplification of a signal Ve entering via the left of the system and exiting as an amplified signal Vs via the right of the system. This system comprises four power amplifiers (101.A, 101.8, 101.0 and 101.D). These power amplifiers may have different characteristics. For example, the amplifiers may have a different bandwidth, a different center frequency and/or a different class. They are therefore adapted for amplifying signals with different characteristics. The system on FIG. 1 also comprises a summing device 102 for the different signals originating from the different power amplifiers. This summing is able to be performed, for example, using a device known as a DAT for 'Distributed Active Transformer'. This summing device increases the power of the output signal by summing the signals originating from the different power amplifiers. This summing device has, however, the drawback of displaying insertion losses. These insertion losses depend on the bandwidth that the summing device must pass through. For a bandwidth ranging from a frequency of 8.5 GHz to a frequency of 10.5 GHz, the insertion losses are less than 0.7 dB. For a bandwidth ranging from a frequency of 4.5 GHz to a frequency of 18 GHz, the insertion losses are less than 3 dB. The system described on FIG. 1 also comprises a device 103 for turning off one or more amplifiers, when these are not used. For example, when the signal to be amplified does not have characteristics that correspond to one of the amplifiers, this may be turned off. This turning off in particular limits the consumption of the amplification system, it also limits the heating of this system.

This system also comprises a device known as a Driver or pre-amplification stage, which is used to adapt and convert the power and impedance parameters. This pre-stage can also perform the role of a pre-amplification stage that supplies the input power required for the power stage and the addition of gain to the overall amplifier. This system also comprises a device called an adaptation stage which is used to adapt the output impedance of the driver to the input impedance of the amplifying devices.

Figure 2:
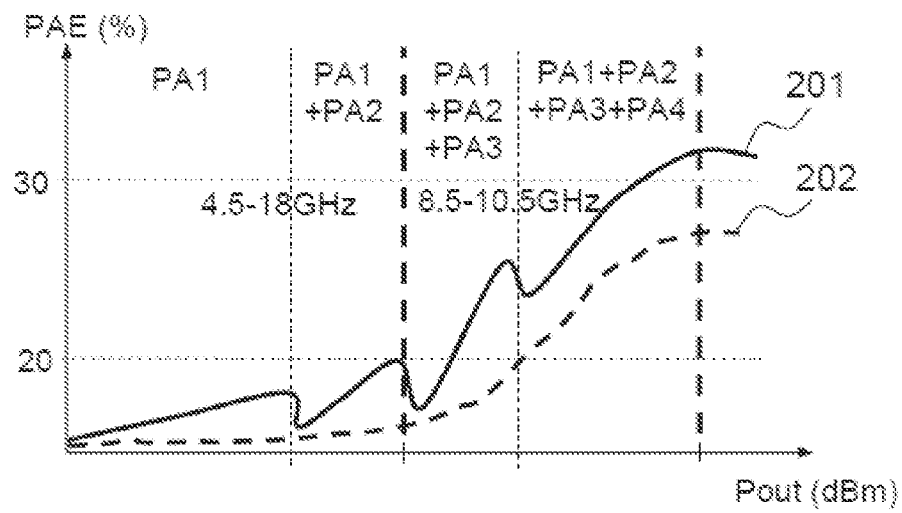
FIG. 2 depicts a comparison between the performance of the system set out in the invention and the prior art systems

FIG. 2 depicts a graph of the performance of the system as set out in the invention. The dashed line curve depicts the performance, expressed by the efficiency or PAE for 'Power Added Efficiency', of known systems in the prior art using GaN technology. The solid curve depicts the performance of the system according to the invention.

The system therefore allows a better compromise between the bandwidth and efficiency of amplification. Furthermore, the system can be adapted according to the frequency band used. This system therefore allows the simultaneous amplification of two different types of signals. The first signal may, for example, have a high power but a restricted frequency bandspread. This type of signal is, for example, used in radars known under the acronym SAR for 'Synthetic Aperture Radar'. The second signal may, for example, have a wide frequency bandspread, but a low power. This second type of signal is used, for example, for telecommunication type applications. The time during which the system amplifies the first radar signal is of the order of 10 to 20% of the total time. The power in this case needs to be maximum since the free-space attenuation varies according to the equation $1/R^4$ where R is the distance traveled by the signal. The required power is therefore greater than the power used for transmitting the second communication signal. Indeed, in the case of the second type of signal, the attenuation varies according to the equation $1/R^2$. In the case of radar the energy is backscattered by the target and travels twice the path. In the case of a communication signal the losses are those of a single path. Therefore, more energy is needed in the case of radar than in the case of communication. Poor efficiency in the case of radar is more punitive since it is multiplied by a significant figure. When maximum power is used, it is important to optimize the efficiency.

Such a system therefore provides the best compromise between the frequency bandspread that the system may pass through and the efficiency of the system. This is achieved through the adaptability of the system for optimizing efficiency according to the use of power. This system is therefore adapted for use in a multifunction system. Communication needs may be limited to low efficiency broadband circuits; but the required powers are also low and therefore the absolute loss is acceptable. This system therefore has the advantages of a broadband circuit without having the major drawback of a low efficiency in the case of amplifying a narrowband signal.

Figure 3:
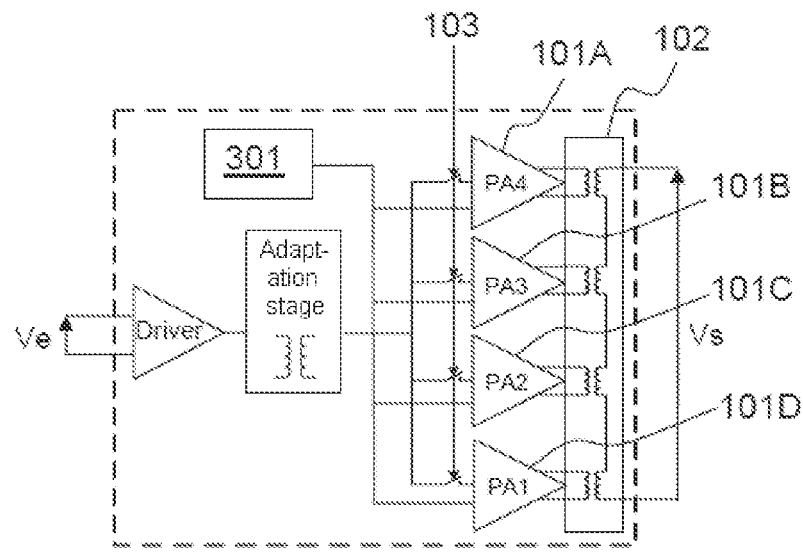
FIG. 3 depicts a second embodiment of the system set out in the invention

On FIG. 3, a temperature sensor 301 is added. It can be used to automatically disconnect all or some of the power amplifiers in the case when the internal temperature exceeds a threshold. This threshold varies according to the technology and depends on the junction temperature limit of the transistors. It will be set taking into account the cooling capacitances that can be installed around the chip.

Figure 4:
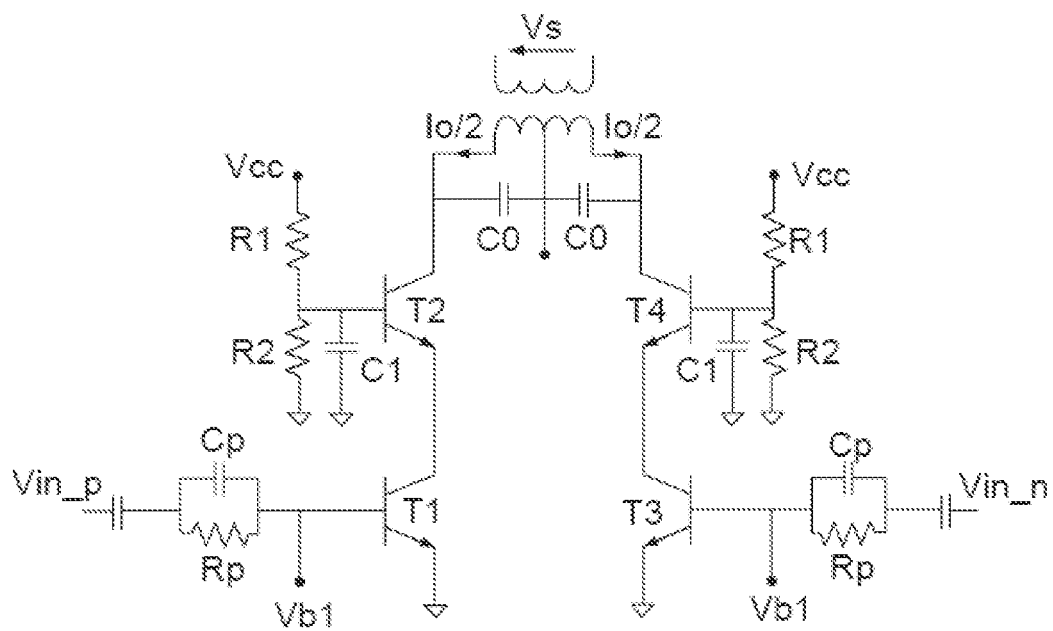
FIG. 4 depicts an embodiment of the power amplifiers

FIG. 4 depicts an embodiment of the different power amplifiers. In this embodiment the different capacitances Cp, C1 and C0 can be used to determine the frequency bandspread for which the signal amplification is optimal.

Figure 5:
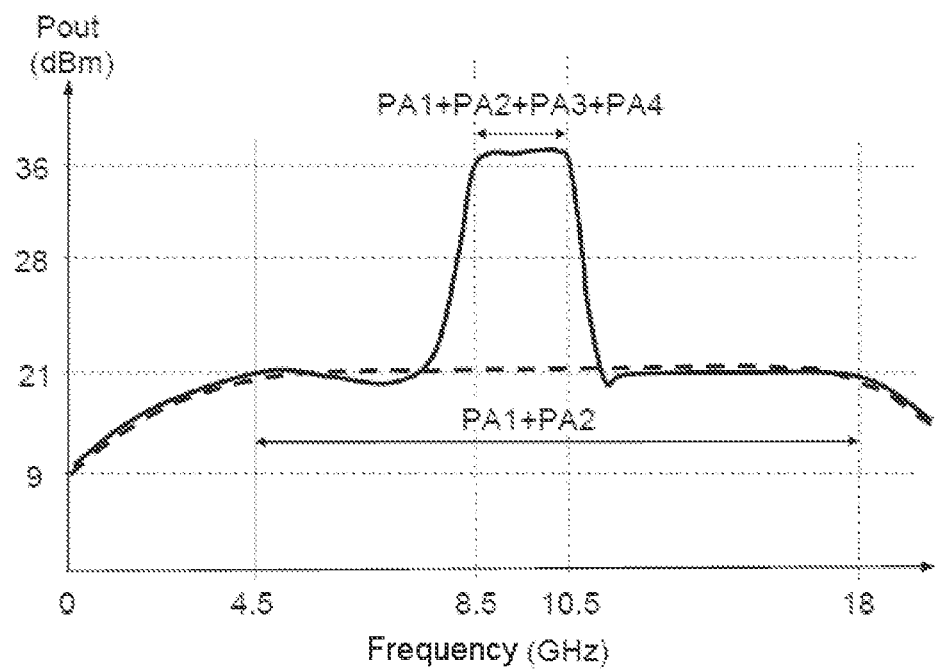
FIG. 5 depicts the output power of the third embodiment of the system

FIG. 5 depicts the output signal power of this third embodiment of the system. In this embodiment, two modes are available, a high power mode and a medium mode power. The medium power mode corresponds to a power of 21 dBm and is used in a frequency bandspread ranging from a frequency of 4.5 GHz to a frequency of 18 GHz. The high power mode corresponds to a power of 36 dBm and is used in a frequency bandspread ranging from a frequency of 8.5 GHz to a frequency of 10.5 GHz.

Figure 6:
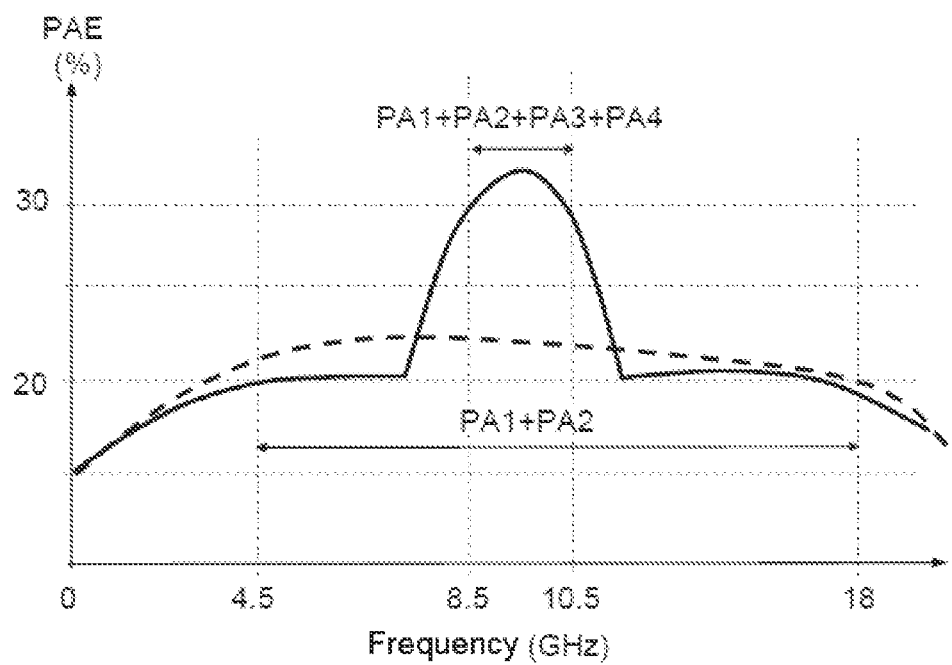
FIG. 6 depicts the efficiency of the third embodiment of the system

FIG. 6 depicts the efficiency of the third embodiment of the system. This efficiency is configurable and adaptable. The average efficiency is 20% and is associated with a consumption of 0.3 A. This efficiency is present between a frequency of 4.5 GHz and a frequency of 18 GHz. High efficiency is 30% and is associated with a consumption of 3 A. This efficiency is present between a frequency of 8.5 GHz and a frequency of 10.5 GHz.

This third embodiment therefore optimizes the consumption and heat dissipation of the system.

It is also possible in order to improve the performance of the system to switch the class of the application devices between class A and class AB, for example, according to the signals to be processed.

Figure 7:
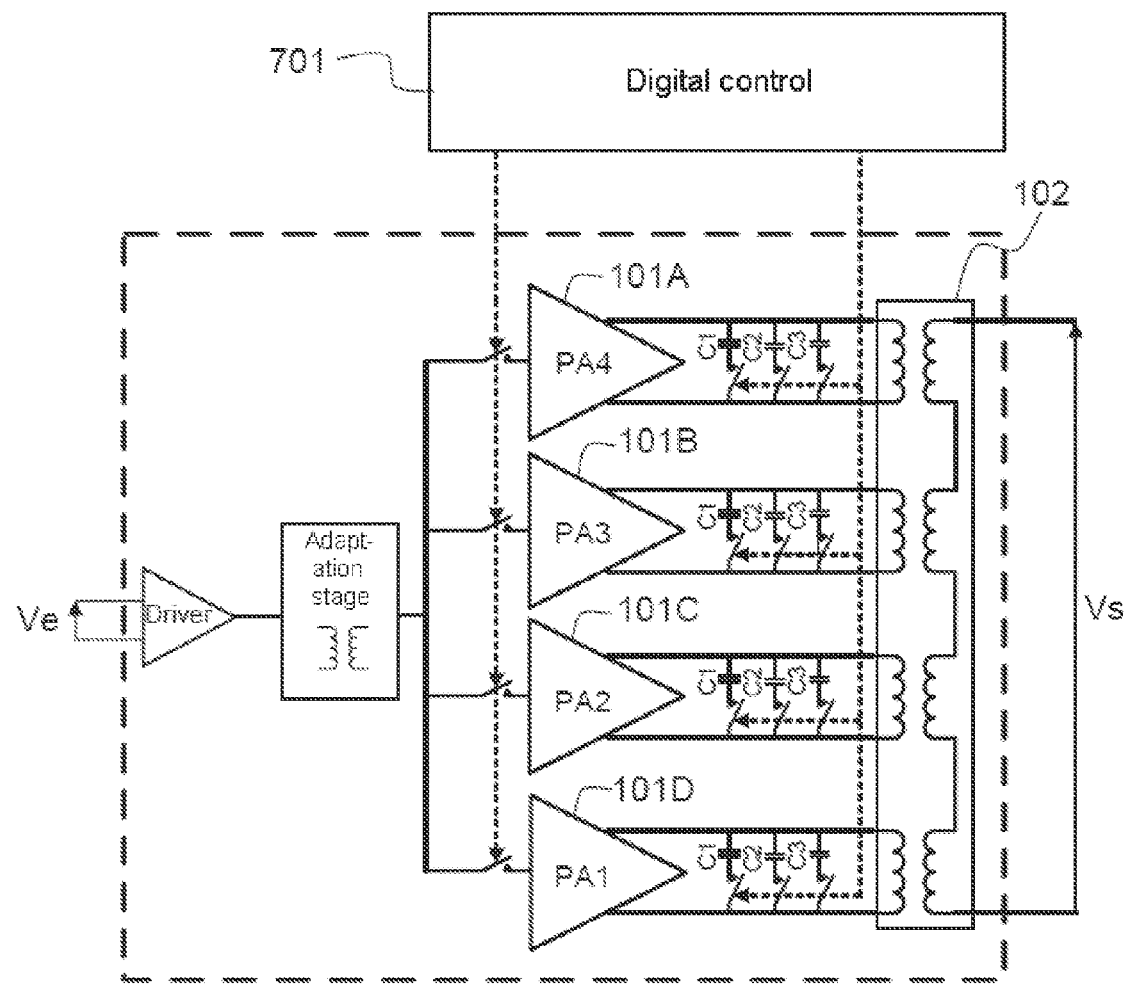
FIG. 7 depicts the switching principle of the adapting devices for dynamically modulating the bandwidth.

In one embodiment the adapting devices are able to be activated and/or are dynamically reconfigurable, as depicted on FIG. 7. This allows having an amplification system that can adapt to the amplification of a signal whereof the center frequency of the signal evolves over time (also known as a frequency hopping signal or system) and adapt to the useful bandwidth of the signal to be amplified, by optimizing the efficiency. This function is implemented, for example, by a digital controller 701 as represented on FIG. 7.

Figure 8:
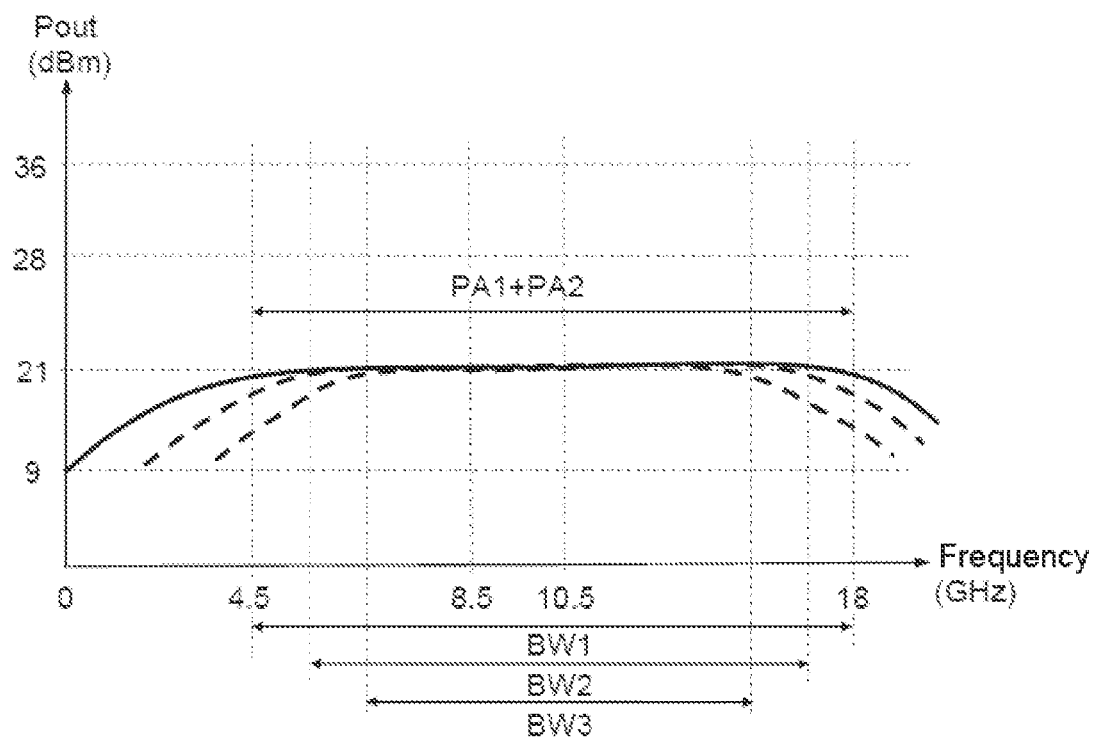
FIG. 8 depicts the performance of the device during a dynamic change in the transmission center frequency.

Thus this embodiment allows a dynamic change in the center frequency. This change enables 'following' the frequency to be transmitted and to be protected from the generation of harmonics inherent to broadband transmission. This is illustrated in particular on FIG. 8.

Figure 9:
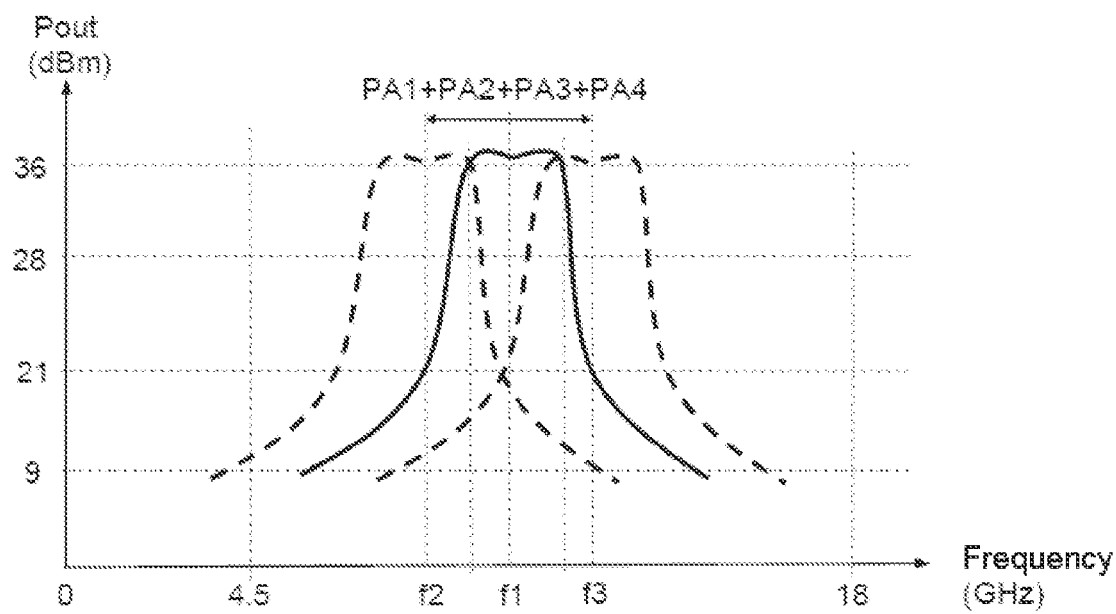
FIG. 9 depicts the performance of the device during a dynamic bandwidth change in the amplified signal.

Finally, it is also possible to have bandwidth amplifiers that are programmable according to, for example, the transmission rate or the desired resolution of an image originating from a satellite using a Synthetic Aperture Radar (also known under the acronym of SAR). In this case it is possible as depicted on FIG. 9 to adapt the amplifiers to be activated or reconfigured according to the useful bandwidth.

The invention claimed is:
1. An input signal amplification system, comprising:
at least two different amplifiers, for amplifying input signals in order to obtain amplified signals;
at least one summing device for summing said amplified signals; and dynamic selectors for activating/deactivating one or more of the amplifiers based on characteristics of said input signals;

wherein at least two of said amplifiers are adapted for amplifying signals having different frequency bandspreads, at least one said frequency bandspread having a width greater than or equal to one octave, wherein at least one of the two different amplifiers is adapted for amplifying signals including a pure carrier modulated in at least one of a phase, amplitude and frequency, and wherein the other one of the two different amplifiers is adapted for amplifying signals including a succession of pulses.

2. The system as claimed in claim 1 further comprising a controller to reconfigure said amplifiers.

3. The system as claimed in claim 1, wherein at least one other said frequency bandspread has a width less than or equal to one octave.

4. The system as claimed in claim 1, wherein at least one of the amplifiers is produced using SiGe and at least one of the amplifiers is produced using GaN.

5. The system as claimed in claim 1, wherein at least two of said amplifiers use a different amplification class.

6. The system as claimed in claim 1, wherein said dynamic selectors are adapted for activating the amplifiers for which the performance is optimal depending on a frequency bandspread associated with said input signals.

7. The system as claimed in claim 1, wherein said dynamic selectors are adapted for activating the amplifiers for which the performance is optimal depending on a center frequency associated with said input signals.

8. The system as claimed in claim 1, further comprising a temperature sensor for measuring the internal temperature of said system, and in which said dynamic selectors are adapted for activating/deactivating at least one of the amplifiers when said internal temperature exceeds a temperature threshold and/or said controller to reconfigure the amplifiers are adapted for reconfiguring at least one of the amplifiers when said internal temperature exceeds a temperature threshold.

9. The system as claimed in claim 1, further comprising at least one active electronically scanned antenna for the transmission of the summed signals.

10. The system as claimed in claim 1, wherein the frequency bandspread width of at least one amplifier is greater than or equal to two octaves.

11. The system as claimed in claim 1, wherein the frequency bandspread width of at least one amplifier is greater than or equal to four octaves.

* * * * *